US012588294B2

(12) United States Patent
Hung et al.

(10) Patent No.: US 12,588,294 B2
(45) Date of Patent: Mar. 24, 2026

(54) LOW-LEAKAGE ESD PROTECTION CIRCUIT AND OPERATING METHOD THEREOF

(71) Applicant: TAIWAN SEMICONDUCTOR MANUFACTURING COMPANY LTD., Hsinchu (TW)

(72) Inventors: Tao Yi Hung, Hsinchu (TW); Li-Wei Chu, Hsinchu City (TW); Wun-Jie Lin, Hsinchu City (TW); Jam-Wem Lee, Hsinchu (TW); Kuo-Ji Chen, Taipei County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 92 days.

(21) Appl. No.: 17/333,687

(22) Filed: May 28, 2021

(65) Prior Publication Data

US 2022/0384421 A1 Dec. 1, 2022

(51) Int. Cl.
*H10D 89/60* (2025.01)
*H01L 23/60* (2006.01)

(52) U.S. Cl.
CPC ........... *H10D 89/819* (2025.01); *H01L 23/60* (2013.01)

(58) Field of Classification Search
CPC ............................. H01L 27/0285; H01L 23/60
USPC ......................................................... 257/355
See application file for complete search history.

(56) References Cited

U.S. PATENT DOCUMENTS

| | | | | | |
|---|---|---|---|---|---|
| 5,321,293 | A | * | 6/1994 | Mojaradi ............. | H10D 84/857 |
| | | | | | 257/357 |
| 5,870,268 | A | * | 2/1999 | Lin ...................... | H01L 27/0259 |
| | | | | | 361/111 |
| 6,671,153 | B1 | * | 12/2003 | Ker ...................... | H01L 27/0262 |
| | | | | | 361/111 |
| 2002/0109153 | A1 | * | 8/2002 | Ker ...................... | H01L 29/7391 |
| | | | | | 257/199 |
| 2006/0092590 | A1 | * | 5/2006 | Chuang ............... | H01L 27/0285 |
| | | | | | 361/91.1 |
| 2007/0058307 | A1 | * | 3/2007 | Mergens ............. | H01L 27/0262 |
| | | | | | 257/E29.225 |
| 2008/0067599 | A1 | * | 3/2008 | Tsutsumi ........... | H10D 84/0181 |
| | | | | | 257/E27.035 |

(Continued)

FOREIGN PATENT DOCUMENTS

| | | | |
|---|---|---|---|
| CN | 104617569 | * | 5/2015 |
| CN | 107403797 | * | 11/2017 |

(Continued)

*Primary Examiner* — Sheng-Bai Zhu
(74) *Attorney, Agent, or Firm* — WPAT LAW; Anthony King

(57) ABSTRACT
A semiconductor device is provided. The semiconductor device comprises a detection circuit electrically coupled between a first node and a second node. The semiconductor device comprises a discharge circuit electrically coupled between the first node and a third node. The semiconductor device comprises a biasing circuit electrically coupled between the second node and the third node. The discharge circuit and the biasing circuit are configured to electrically conduct the first node and the second node in response to receiving a first signal from the detection circuit through a fourth node. A first voltage difference exists between the third node and the fourth node.

20 Claims, 13 Drawing Sheets

(56)      References Cited

U.S. PATENT DOCUMENTS

| | | | |
|---|---|---|---|
| 2012/0307410 A1* | 12/2012 | Yamazaki ........... | H01L 27/0285 |
| | | | 257/E21.409 |
| 2013/0234199 A1* | 9/2013 | Liang ................. | H01L 27/0266 |
| | | | 257/133 |
| 2015/0085406 A1* | 3/2015 | Chen ...................... | H02H 9/046 |
| | | | 361/55 |
| 2015/0162746 A1* | 6/2015 | Ikeda ................... | H02H 9/046 |
| | | | 361/56 |
| 2015/0207313 A1* | 7/2015 | Rupp ....................... | H02H 9/04 |
| | | | 361/56 |
| 2017/0221879 A1* | 8/2017 | Wang ................. | H01L 27/0288 |
| 2017/0229446 A1* | 8/2017 | Fukasaku ............ | H01L 27/0285 |
| 2019/0229531 A1* | 7/2019 | Liao ....................... | H02H 9/046 |

FOREIGN PATENT DOCUMENTS

| | | | | |
|---|---|---|---|---|
| EP | 4057463 A1 * | 9/2022 | ......... | H01L 27/0255 |
| JP | 2016119388 * | 6/2016 | | |
| KR | 20100003569 * | 1/2010 | | |

* cited by examiner

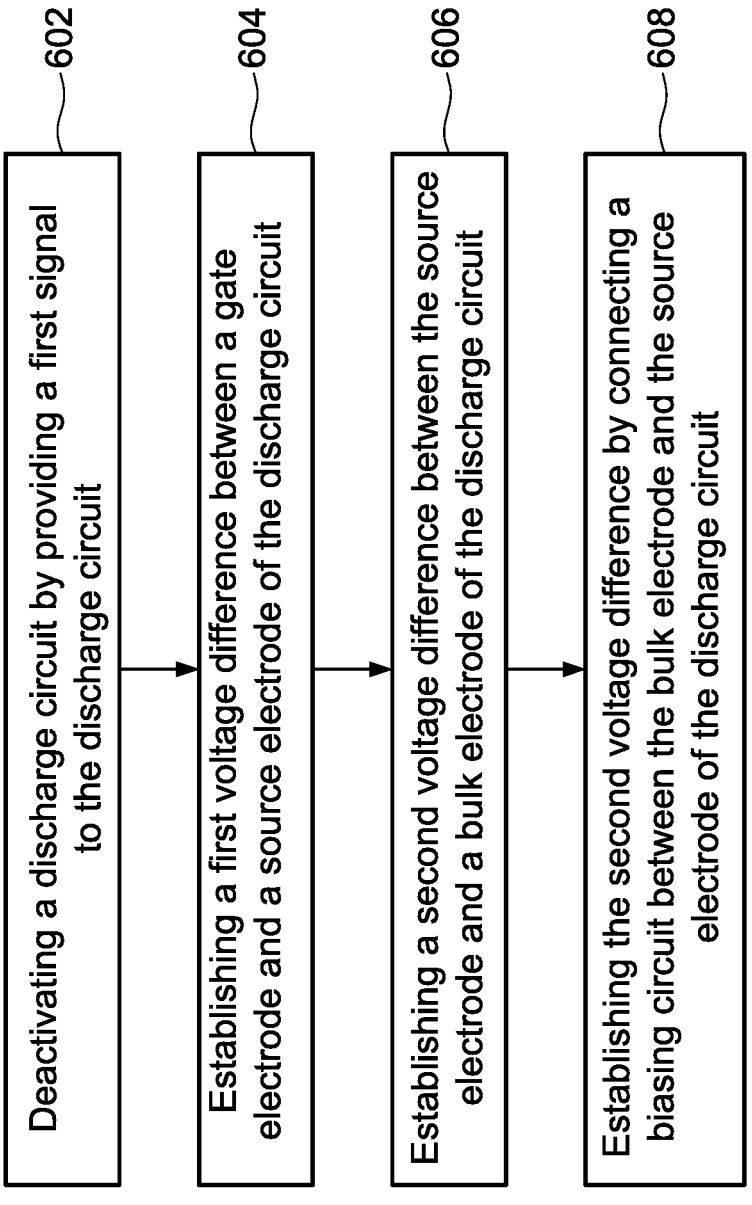

602 — Deactivating a discharge circuit by providing a first signal to the discharge circuit 604 — Establishing a first voltage difference between a gate electrode and a source electrode of the discharge circuit 606 — Establishing a second voltage difference between the source electrode and a bulk electrode of the discharge circuit 608 — Establishing the second voltage difference by connecting a biasing circuit between the bulk electrode and the source electrode of the discharge circuit

LOW-LEAKAGE ESD PROTECTION CIRCUIT AND OPERATING METHOD THEREOF

BACKGROUND

The present invention relates generally to semiconductor devices, and more particularly to a semiconductor device for ESD protection and the operating method thereof.

An ESD protection device protects circuits from electrostatic discharge (ESD) events, to avoid malfunction or damage thereto. When ESD events occur, a spike voltage can be generated between an external inductive load circuit and an electrode (e.g., gate electrode) of a semiconductor device of a semiconductor wafer. The abnormally high voltage can damage the semiconductor devices of the semiconductor wafer by, for example, blowing out the gate oxide. An ESD protection device can prevent circuit failure by rerouting the positive or negative ESD current through a low resistance path.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 6 is a flowchart of semiconductor device operation, in accordance with some embodiments of the present disclosure.

DETAILED DESCRIPTION

Figure 1A:
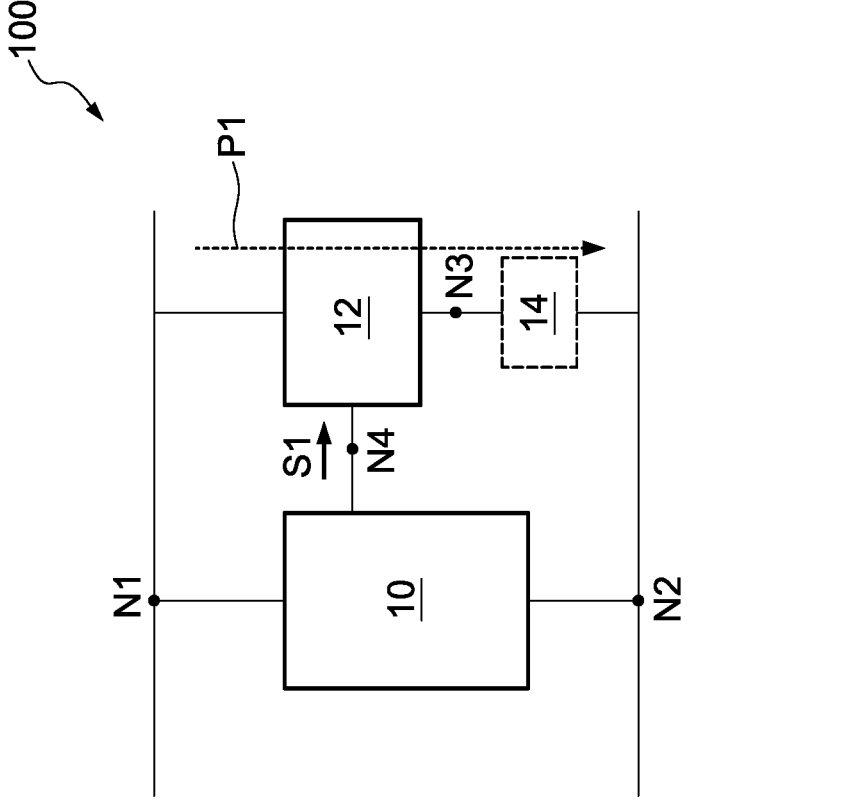
FIG. 1A is a schematic diagram of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A clamp circuit as commonly used in ESD protection devices can be known as an "ESD power-rail clamp circuit" or "ESD clamp circuit." The clamp circuit may include an ESD detection circuit and a discharge device. In general, a discharge device can include relatively large transistors, with commensurately large scale in terms of the channel width. A transistor of large channel width can be referred to as a "BigFET." The term "BigFET" can refer to a N-type or P-type transistor having channel width equaling or exceeding 1000 micrometers (μm).

Discharge devices including a "BigFET" can be a major contributor of current leakage in standby mode of the ESD protection device. That is, when no ESD event occurs, the ESD protection device generates relatively high leakage current. Such leakage current can adversely affect performance or lifetime of the host system that includes the ESD protection device.

FIG. 1A is a schematic diagram of a semiconductor device, in accordance with some embodiments of the present disclosure.

FIG. 1A is a schematic diagram of a semiconductor device 100. The semiconductor device 100 can be a part of an electronic system or semiconductor system. The semiconductor device 100 can be arranged in an output stage of an electronic system. The semiconductor device 100 can be an ESD protection device. The semiconductor device 100 includes a detection circuit 10, a discharge circuit 12, and a biasing circuit 14.

The detection circuit 10 can be electrically coupled between nodes N1 and N2. The detection circuit 10 can be electrically connected between nodes N1 and N2. The discharge circuit 12 can be electrically coupled to nodes N1, N2 and N3. The discharge circuit 12 can be electrically connected to nodes N1, N2 and N3. The biasing circuit 14 can be electrically coupled between nodes N2 and N3. The biasing circuit 14 can be electrically connected between nodes N2 and N3.

A supply voltage VDD can be provided to the node N1. In some embodiments, a positive supply voltage can be provided to the node N1. A reference voltage VSS can be provided to the node N2. In some embodiments, a negative voltage can be provided to the node N2. In some embodiments, the node N2 can be electrically connected to a ground (GND).

The detection circuit 10 can be configured to generate a signal S1 in response to an ESD event. The signal S1 generated by the detection circuit 10 can be provided to the discharge circuit 12 through the node N4. The signal S1 can trigger a current associated with the ESD event to flow through the discharge circuit 12 and the biasing circuit 14.

The discharge circuit 12 can be configured to be turned on/off by the signal S1. When the discharge circuit 12 is turned on in response to the signal S1, a discharge path P1 can be established between the node N1 and N2. The discharge path P1 can be a conductive path. Discharging current can flow from the node N1 to the node N2 through the node N3 when the discharge circuit 12 is turned on.

The discharge circuit 12 turning off can be referred to as a "standby mode" of the semiconductor device 100. The discharge circuit 12 turning off can also be referred to as a "normal operation mode" of a semiconductor system that includes the semiconductor device 100, because no ESD event occurs.

The biasing circuit 14 can be configured to bias the discharge circuit 12. The biasing circuit 14 can be configured to suppress the leakage current of the discharge circuit 12 when it is in the "standby mode." The biasing circuit 14 can be configured to suppress the leakage current of the discharge circuit 12 when the discharge circuit 12 is turned off by the signal S1.

Figure 1B:
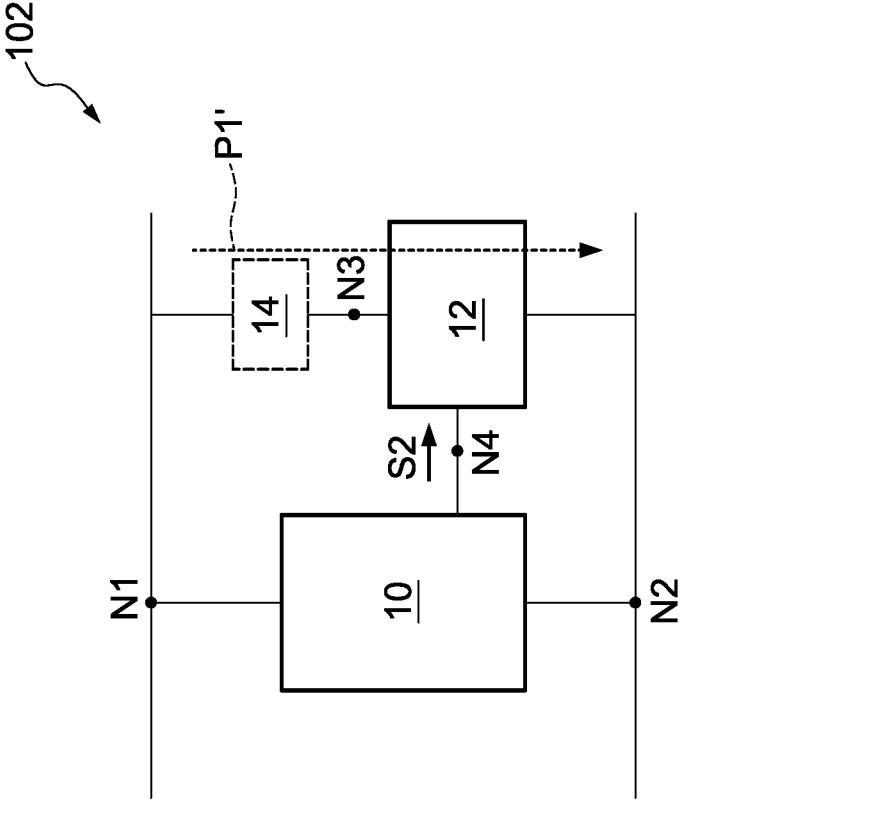
FIG. 1B is a schematic diagram of a semiconductor device, in accordance with some embodiments of the present disclosure.

FIG. 1B is a schematic diagram of a semiconductor device 102. The semiconductor device 102 can be a part of an electronic system. The semiconductor device 102 can be a part of a semiconductor system. The semiconductor device 102 can be arranged in an output stage of an electronic system. The semiconductor device 102 can be an ESD protection device. The semiconductor device 102 includes a detection circuit 10, a discharge circuit 12, and a biasing circuit 14.

The detection circuit 10 can be electrically coupled between nodes N1 and N2. The detection circuit 10 can be electrically connected between nodes N1 and N2. The discharge circuit 12 can be electrically coupled to nodes N2, N3 and N4. The discharge circuit 12 can be electrically connected to nodes N2, N3 and N4. The biasing circuit 14 can be electrically coupled between nodes N1 and N3. The biasing circuit 14 can be electrically connected between nodes N1 and N3.

A supply voltage VDD can be provided to the node N1. In some embodiments, a positive supply voltage can be provided to the node N1. A reference voltage VSS can be provided to the node N2. In some embodiments, a negative voltage can be provided to the node N2. In some embodiments, the node N2 can be electrically connected to a ground (GND).

The detection circuit 10 can be configured to generate a signal S2 in response to an ESD event. The signal S2 generated by the detection circuit 10 can be provided to the discharge circuit 12 through the node N4. The signal S2 can trigger a current associated with the ESD event to flow through the biasing circuit 14 and the discharge circuit 12.

The discharge circuit 12 can be configured to be turned on/off by the signal S2. When the discharge circuit 12 is turned on in response to the signal S2, a discharge path P1' can be established between the node N1 and N2. The discharge path P1' can be a conductive path. Discharging current can flow from the node N1 to the node N2 through the node N3 when the discharge circuit 12 is turned on.

The discharge circuit 12 turning off can be referred to as a "standby mode" of the semiconductor device 102. The discharge circuit 12 turning off can also be referred to as a "normal operation mode" of a semiconductor system that includes the semiconductor device 102, because no ESD event occurs.

The biasing circuit 14 can be configured to bias the discharge circuit 12. The biasing circuit 14 can be configured to suppress the leakage current of the discharge circuit 12 when it is in the "standby mode." The biasing circuit 14 can be configured to suppress the leakage current of the discharge circuit 12 when the discharge circuit 12 is turned off by the signal S2.

Figure 2A:
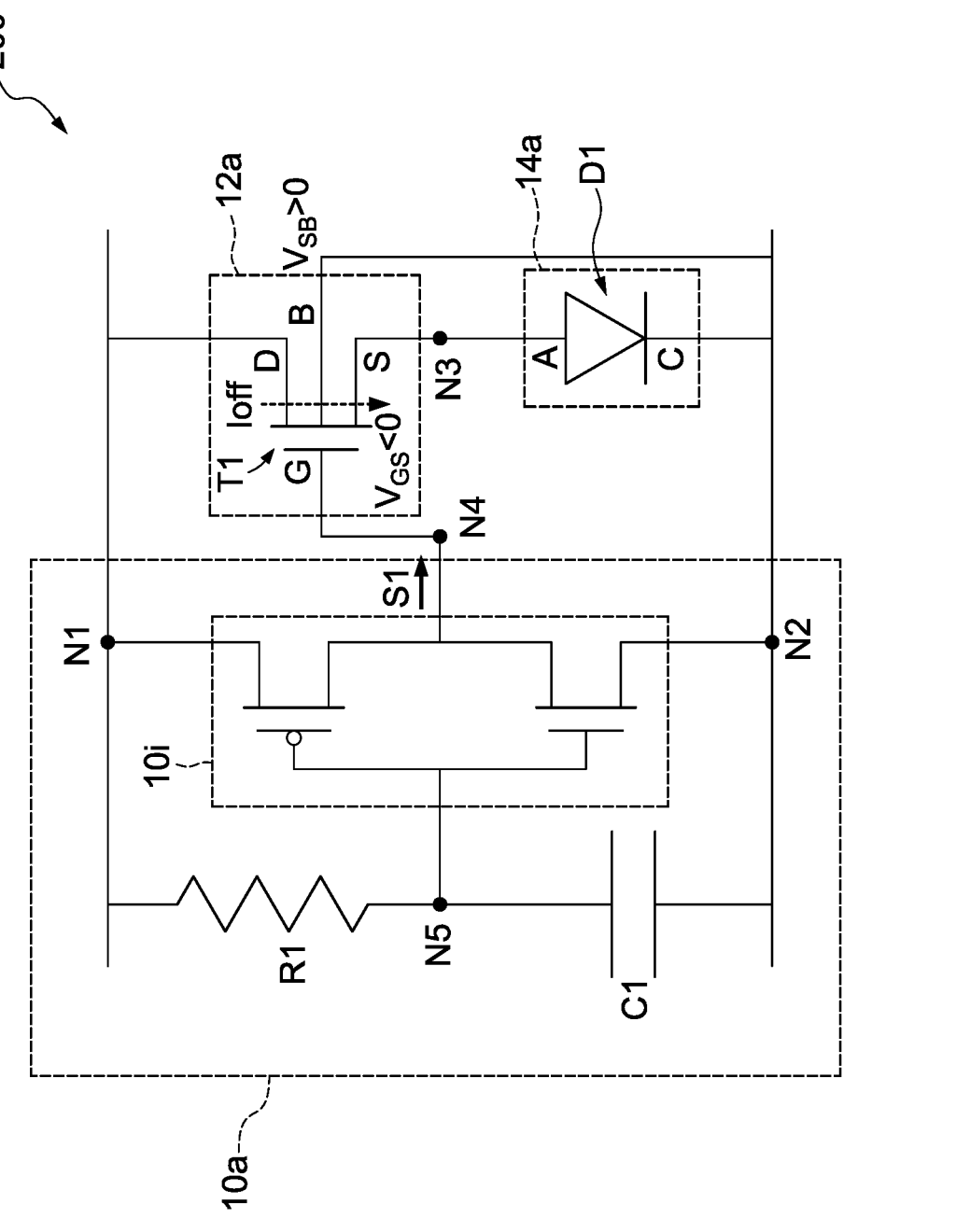
FIG. 2A is a schematic diagram of a semiconductor device, in accordance with some embodiments of the present disclosure.

FIG. 2A is a schematic diagram of a semiconductor device, in accordance with some embodiments of the present disclosure.

FIG. 2A is a schematic diagram of a semiconductor device 200. The semiconductor device 200 can be a part of an electronic system. The semiconductor device 200 can be a part of a semiconductor system. The semiconductor device 200 can be arranged in an output stage of an electronic system. The semiconductor device 200 can be an ESD protection device. The semiconductor device 200 includes a detection circuit 10a, a discharge circuit 12a, and a biasing circuit 14a.

The detection circuit 10a can be electrically coupled/connected between the nodes N1 and N2. The detection circuit 10a includes a resistor R1, a capacitor C1, and an inverting circuit 10i. The resistor R1 can be electrically coupled/connected between the nodes N1 and N5. The capacitor C1 can be electrically coupled/connected between the nodes N2 and N5. The inverting circuit 10i can be electrically coupled/connected to the nodes N1, N2 and N5. The node N5 can be an internal node within the detection circuit 10a.

The inverting circuit 10i includes a p-type transistor and a n-type transistor. In some embodiments, the inverting circuit 10i can include an p-type MOSFET (PMOS) and an n-type MOSFET (NMOS). The node N5 can be referred to as an input of the inverting circuit 10i. The node N4 can be referred to as an output of the inverting circuit 10i.

The discharge circuit 12a can be electrically coupled/connected to the nodes N1, N2, N3 and N4. The discharge circuit 12a can include a transistor T1. The transistor T1 includes a gate electrode G, a drain electrode D, a source electrode S, and a bulk electrode B. The gate electrode G of the transistor T1 can be electrically connected to the node N4. The gate electrode G of the transistor T1 is configured to receive the signal S1 provided by the detection circuit 10a.

The drain electrode D of the transistor T1 can be electrically connected to the node N1. The bulk electrode B of the transistor T1 can be electrically connected to the node N2. The source electrode S of the transistor T1 can be electrically connected to the biasing circuit 14a through the node N3.

The biasing circuit 14a can be electrically coupled/connected between the nodes N2 and N3. The biasing circuit 14a can include a diode D1. The diode D1 includes an anode A and a cathode C. The anode A of the diode D1 is electrically connected/coupled to the node N3. The cathode C of the diode D1 is electrically connected/coupled to the node N2. The diode D1 can have a P-type doped region embedded within a N-type well region. The diode D1 can be an P+/NW diode.

The operations of the detection circuit 10a when an ESD event occurs are as follows. When an ESD event occurs, a high voltage level can be suddenly applied to the node N1. Due to the propagation delay contributed by the resistor R1 and the capacitor C1, the node N5 remains at low voltage level for a specific period. The low voltage level at the node N5 and the high voltage level at the node N1 will turn on the p-type transistor of the inverting circuit 10i, and then pull up the voltage level at the node N4. The voltage level at the node N4 will be pulled up to near the high voltage level at the node N1. The voltage level at the node N4 transition from low to high can correspond to a signal S1 provided at the node N4. The signal S1 can provided to the discharge circuit 12a and turns on the transistor T1.

A conductive path can be established between the nodes N1 and N2 when the discharge circuit 12a is turned on in response to the signal S1. A conductive path can be established between the nodes N1 and N2 when the transistor T1 is turned on. The high voltage level incurred at the node N1 by the ESD event can be routed to the node N2 through the discharge circuit 12a and the biasing circuit 14a.

Operations during the "standby mode" (i.e., when no ESD event occur and the discharge circuit 12a is off) of the semiconductor device 200 are herein described. When no ESD event occurs, the node N4 is configured at a low voltage level so as to keep the discharge circuit 12a off. The voltage level at the node N3 will be at around half of that of the node N1, following the voltage divider rule. As a result, the voltage level at the gate electrode G of the transistor T1 will be lower than that of the source electrode S of the transistor T1. That is, a negative voltage $V_{GS}$ can be established between the gate electrode G and the source electrode S of the transistor T1.

In addition, the voltage level at the source electrode S of the transistor T1 will exceed that of the bulk electrode B of the transistor T1. That is, a positive voltage $V_{SB}$ can be established between the source electrode S and the bulk electrode B of the transistor T1.

Assuming that current $I_{off}$ flows from the node N1 to the node N3 when the transistor T1 is turned off (i.e., the discharge circuit 12a is off, or in the "standby mode"). The current $I_{off}$ can be the major contributor of the current leakage when the semiconductor device 200 is in the "standby mode."

A current $I_D$ that flows from the node N1 to the node N3 through the transistor T1 can be calculated based on the following equation.

$$I_D = \mu_n C_{ox} \frac{W}{L}\left(V_{GS} - V_{th} - \frac{V_{DS}}{2}\right)V_{DS} \qquad \text{(Euation 1)}$$

In Equation 1, $\mu_n$ is the charge-carrier effective mobility, $C_{ox}$ is the gate oxide capacitance per unit area, W is the gate width, L is the gate length and, $V_{GS}$ is the gate-to-source bias, $V_{th}$ is the threshold voltage, and $V_{DS}$ is the drain-to-source bias.

When the body effect of the transistor is taken into consideration, the threshold voltage of the transistor T1 can be calculated based on the following equation.

$$V_{TB} = V_{T0} + \gamma(\sqrt{V_{SB} + 2\varphi} - \sqrt{2\varphi}) \qquad \text{(Equation 2)}$$

In Equation 2, $V_{TB}$ is the threshold voltage with substrate bias present, and $V_{T0}$ is the threshold voltage when $V_{SB}=0$, $\gamma$ is the body effect parameter, and $2\varphi$ is the approximate potential drop between surface and bulk across the depletion layer when $V_{SB}=0$. As Equation 2 shows, a bias $V_{SB}>0$ causes an increase in threshold voltage $V_{TB}$. In addition, as Equation 1 shows, increasing the threshold voltage $V_{th}$ can cause a decrease of the current $I_D$. Furthermore, according to Equation 1, a bias $V_{GS}<0$ also cause a decrease of the current $I_D$.

Accordingly, based on Equations 1 and 2, current $I_{off}$ when the discharge circuit 12a is off can be decreased with bias $V_{SB}>0$ and $V_{GS}<0$. Therefore, the semiconductor device 200 with the biasing circuit 14a incorporated can exhibit a much lower standby current. A semiconductor system that includes the semiconductor device 200 as an ESD protection device can exhibit a longer lifetime.

Figure 2B:
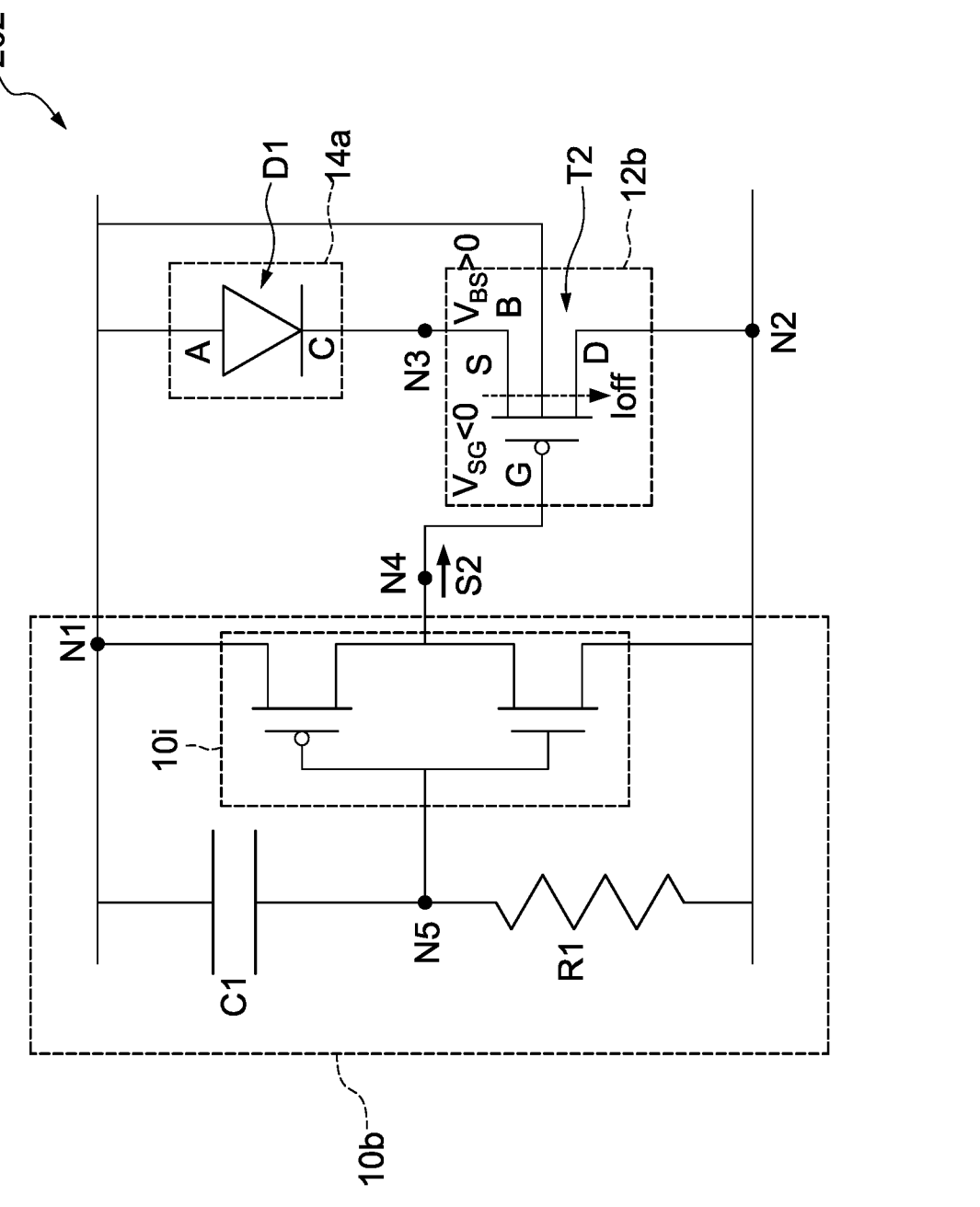
FIG. 2B is a schematic diagram of a semiconductor device, in accordance with some embodiments of the present disclosure.

FIG. 2B is a schematic diagram of a semiconductor device, in accordance with some embodiments of the present disclosure.

FIG. 2B is a schematic diagram of a semiconductor device 202. The semiconductor device 202 can be a part of an electronic system. The semiconductor device 202 can be a part of a semiconductor system. The semiconductor device 202 can be an ESD protection device. The semiconductor device 202 includes a detection circuit 10*b*, a discharge circuit 12*b*, and a biasing circuit 14*a*.

The detection circuit 10*b* can be electrically coupled/connected between the nodes N1 and N2. The detection circuit 10*b* includes a resistor R1, a capacitor C1, and an inverting circuit 10*i*. The resistor R1 can be electrically coupled/connected between the nodes N2 and N5. The capacitor C1 can be electrically coupled/connected between the nodes N1 and N5. The inverting circuit 10*i* can be electrically coupled/connected to the nodes N1, N2 and N5. The node N5 can be an internal node within the detection circuit 10*b*.

The inverting circuit 10*i* includes a p-type transistor and an n-type transistor. In some embodiments, the inverting circuit 10*i* can include a PMOS and an NMOS. The node N5 can be referred to as an input of the inverting circuit 10*i*. The node N4 can be referred to as an output of the inverting circuit 10*i*.

The discharge circuit 12*b* can be electrically coupled/connected to the nodes N1, N2, N3 and N4. The discharge circuit 12*b* can include a transistor T2. The transistor T2 includes a gate electrode G, a drain electrode D, a source electrode S, and a bulk electrode B. The gate electrode G of the transistor T2 can be electrically connected to the node N4. The gate electrode G of the transistor T2 is configured to receive the signal S2 provided by the detection circuit 10*b*.

The drain electrode D of the transistor T2 can be electrically connected to the node N2. The bulk electrode B of the transistor T2 can be electrically connected to the node N1. The source electrode S of the transistor T2 can be electrically connected to the biasing circuit 14*a* through the node N3.

The biasing circuit 14*a* can be electrically coupled/connected between the nodes N1 and N3. The biasing circuit 14*a* can include a diode D1. The diode D1 includes an anode A and a cathode C. The anode A of the diode D1 is electrically connected/coupled to the node N1. The cathode C of the diode D1 is electrically connected/coupled to the node N3. The diode D1 can have a P-type doped region embedded within a N-type well region. The diode D1 can be an P+/NW diode.

Operations of the detection circuit 10*b* when an ESD event occurs are as follows. When no ESD event occurs, the node N4 is configured at a high voltage level so as to keep the discharge circuit 12*b* off.

When an ESD event occurs, a high voltage level can be suddenly applied to the node N1. The voltage level at the node N5 will be pulled up to the high voltage level through the direct coupling of the capacitor C1, the high voltage level at the node N5 turns on the n-type transistor of the inverting circuit 10*i*, and as a result the voltage level at the node N4 will be pulled low. The voltage level at the node N4 transitioning from high to low can correspond to a signal S2 provided at the node N4. The signal S2 can provided to the discharge circuit 12*b* and turns on the transistor T2.

A conductive path can be established between the nodes N1 and N2 when the discharge circuit 12*b* is turned on in response to the signal S2. A conductive path can be established between the nodes N1 and N2 when the transistor T2 is turned on. The high voltage level incurred at the node N1 by the ESD event can be routed to the node N2 through the biasing circuit 14*a* and the discharge circuit 12*b*.

Operations during the "standby mode" (i.e., when no ESD event occur and the discharge circuit 12*b* is off) of the semiconductor device 202 are as follows. When no ESD event occurs, the node N4 is configured at a high voltage level so as to keep the discharge circuit 12*b* off. The voltage level at the node N3 will be at around half of that of the node N1, following the voltage divider rule. As a result, the voltage level at the gate electrode G of the transistor T2 will exceed that of the source electrode S of the transistor T2. That is, a negative voltage $V_{SG}$ can be established between source electrode S and the gate electrode G of the transistor T2.

In addition, the voltage level at the source electrode S of the transistor T2 will be lower than that of the bulk electrode B of the transistor T2. That is, a positive voltage $V_{BS}$ can be established between the bulk electrode B and the source electrode S of the transistor T2.

Assuming that current $I_{off}$ is the current that flows from the node N3 to the node N1 when the transistor T2 is turned off (i.e., the discharge circuit 12*b* is off, or in the "standby mode"). The current $I_{off}$ can be the major contributor of the current leakage when the semiconductor device 202 is in the "standby mode."

Based on Equations 1 and 2, current $I_{off}$ when the discharge circuit 12*b* is off can be decreased with bias $V_{BS}{>}0$ and $V_{SG}{<}0$. Therefore, the semiconductor device 202 with the biasing circuit 14*a* incorporated can exhibit a much lower standby current. A semiconductor system that includes the semiconductor device 202 as an ESD protection device can exhibit a longer lifetime.

Figure 3A:
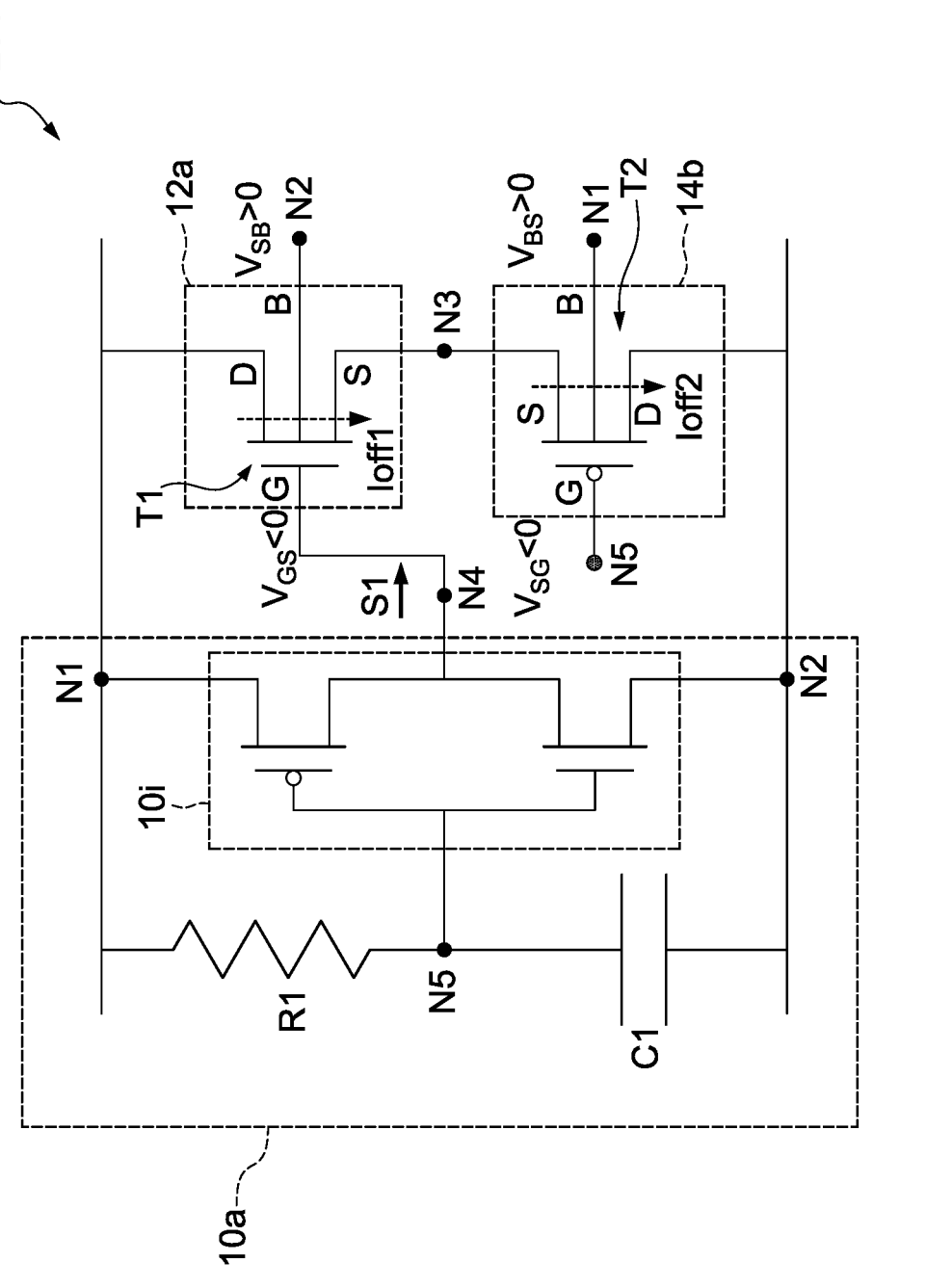
FIG. 3A is a schematic diagram of a semiconductor device, in accordance with some embodiments of the present disclosure.

FIG. 3A is a schematic diagram of a semiconductor device, in accordance with some embodiments of the present disclosure.

FIG. 3A is a schematic diagram of a semiconductor device 204. The semiconductor device 204 can be a part of an electronic system. The semiconductor device 204 can be a part of a semiconductor system. The semiconductor device 204 can be an ESD protection device. The semiconductor device 204 includes a detection circuit 10*a*, a discharge circuit 12*a*, and a biasing circuit 14*b*.

The detection circuit 10*a* can be electrically coupled/connected between the nodes N1 and N2. The detection circuit 10*a* includes a resistor R1, a capacitor C1, and an inverting circuit 10*i*. The resistor R1 can be electrically coupled/connected between the nodes N1 and N5. The capacitor C1 can be electrically coupled/connected between the nodes N2 and N5. The inverting circuit 10*i* can be electrically coupled/connected to the nodes N1, N2 and N5. The node N5 can be an internal node within the detection circuit 10*a*.

The inverting circuit 10*i* includes a p-type transistor and an n-type transistor. In some embodiments, the inverting circuit 10*i* can include a PMOS and an NMOS. The node N5 can be referred to as an input of the inverting circuit 10*i*. The node N4 can be referred to as an output of the inverting circuit 10*i*.

The discharge circuit 12*a* can be electrically coupled/connected to the nodes N1, N2, N3 and N4. The discharge circuit 12*a* can include a transistor T1. The transistor T1 includes a gate electrode G, a drain electrode D, a source electrode S, and a bulk electrode B. The gate electrode G of the transistor T1 can be electrically connected to the node N4. The gate electrode G of the transistor T1 is configured to receive the signal S1 provided by the detection circuit 10*a*.

The drain electrode D of the transistor T1 can be electrically connected to the node N1. The bulk electrode B of the transistor T1 can be electrically connected to the node N2. The source electrode S of the transistor T1 can be electrically connected to the biasing circuit 14b through the node N3. With the biasing circuit 14b connected between the nodes N2 and N3, the discharge circuit 12a can be bias with $V_{GS}<0$ and $V_{SB}>0$ in the standby mode.

Based on Equations 1 and 2, current $I_{off}$ of the transistor T1 when the discharge circuit 12a is off can be decreased with bias $V_{GS}<0$ and $V_{SB}>0$. Therefore, the semiconductor device 204 with the biasing circuit 14b incorporated can exhibit a much lower standby current. A semiconductor system that includes the semiconductor device 204 as an ESD protection device can exhibit a longer lifetime.

The biasing circuit 14b can be electrically coupled/connected between the nodes N2 and N3. The biasing circuit 14b can be electrically coupled/connected between the source electrode S and the bilk electrode B of the transistor T1. The biasing circuit 14b can include a transistor T2. The biasing circuit 14b can include a p-type transistor. The biasing circuit 14b can include a PMOS. The biasing circuit 14b and the discharge circuit 12a can include transistors of different types. The transistor T2 includes a gate electrode G, a source electrode S, a drain electrode D, and a bulk electrode B.

The gate electrode G of the transistor T2 can be electrically connected/coupled to an internal node of the detection circuit 10a. The gate electrode G of the transistor T2 can be electrically connected/coupled to the node N5. The bulk electrode B of the transistor T2 can be electrically connected to the node N1.

In the standby mode, the biasing circuit 14b can be bias with $V_{SG}<0$ and $V_{BS}>0$. In the standby mode, the voltage level at the node N4 is configured to be low (for example, VSS) in order to keep the discharge circuit 12a off. In this circumstance, the node N5 at the input of the inverting circuit 10i will be configured to a high voltage level (for example, VDD). The node N1 is supplied with a high voltage level (for example, VDD), and the node N2 is supplied with a low voltage level (for example, VSS). The voltage level at the node N3 will be at around half of that of the node N1, following the voltage divider rule. As a result, the biasing circuit 14b can be bias with $V_{SG}<0$ and $V_{BS}>0$ in the standby mode.

Based on Equations 1 and 2, current $I_{off2}$ of the transistor T2 when the discharge circuit 12a is off (i.e., in the standby mode) can be decreased with bias $V_{SG}<0$ and $V_{BS}>0$. Therefore, the semiconductor device 204 with the biasing circuit 14b incorporated can exhibit a much lower standby current. A semiconductor system that includes the semiconductor device 204 as an ESD protection device can exhibit a longer lifetime.

Figure 3B:
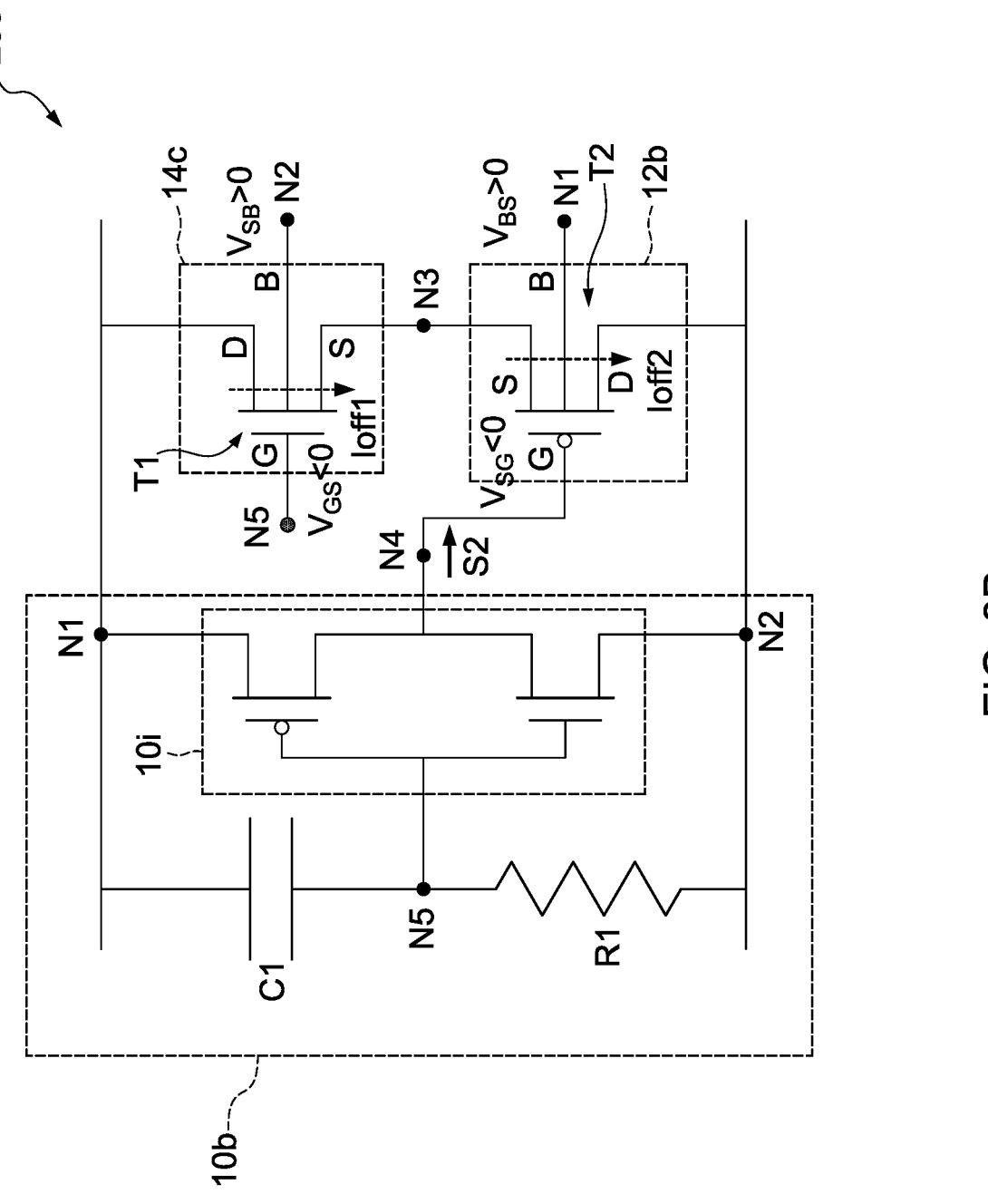
FIG. 3B is a schematic diagram of a semiconductor device, in accordance with some embodiments of the present disclosure.

FIG. 3B is a schematic diagram of a semiconductor device, in accordance with some embodiments of the present disclosure.

FIG. 3B is a schematic diagram of a semiconductor device 206. The semiconductor device 206 can be a part of an electronic system. The semiconductor device 206 can be a part of a semiconductor system. The semiconductor device 206 can be an ESD protection device. The semiconductor device 206 includes a detection circuit 10b, a discharge circuit 12b, and a biasing circuit 14c.

The detection circuit 10b can be electrically coupled/connected between the nodes N1 and N2. The detection circuit 10b includes a resistor R1, a capacitor C1, and an inverting circuit 10i. The resistor R1 can be electrically coupled/connected between the nodes N2 and N5. The capacitor C1 can be electrically coupled/connected between the nodes N1 and N5. The inverting circuit 10i can be electrically coupled/connected to the nodes N1, N2 and N5. The node N5 can be an internal node within the detection circuit 10b.

The inverting circuit 10i includes a p-type transistor and an n-type transistor. In some embodiments, the inverting circuit 10i can include a PMOS and an NMOS. The node N5 can be referred to as an input of the inverting circuit 10i. The node N4 can be referred to as an output of the inverting circuit 10i.

The discharge circuit 12b can be electrically coupled/connected to the nodes N1, N2, N3 and N4. The discharge circuit 12b can include a transistor T2. The transistor T2 includes a gate electrode G, a drain electrode D, a source electrode S, and a bulk electrode B. The gate electrode G of the transistor T2 can be electrically connected to the node N4. The gate electrode G of the transistor T2 is configured to receive the signal S2 provided by the detection circuit 10b.

The drain electrode D of the transistor T2 can be electrically connected to the node N2. The bulk electrode B of the transistor T2 can be electrically connected to the node N1. The source electrode S of the transistor T2 can be electrically connected to the biasing circuit 14c through the node N3. With the biasing circuit 14c connected between the nodes N1 and N3, the discharge circuit 12b can be bias with $V_{SG}<0$ and $V_{BS}>0$ in the standby mode.

Based on Equations 1 and 2, current $I_{off2}$ of the transistor T2 when the discharge circuit 12b is off can be decreased with bias $V_{SG}<0$ and $V_{BS}>0$. Therefore, the semiconductor device 206 with the biasing circuit 14c incorporated can exhibit a much lower standby current. A semiconductor system that includes the semiconductor device 206 as an ESD protection device can exhibit a longer lifetime.

The biasing circuit 14c can be electrically coupled/connected between the nodes N1 and N3. The biasing circuit 14c can be electrically coupled/connected between the source electrode S and the bilk electrode B of the transistor T2. The biasing circuit 14c can include a transistor T1. The biasing circuit 14c can include a n-type transistor. The biasing circuit 14c can include a NMOS. The biasing circuit 14c and the discharge circuit 12b can include transistors of different types. The transistor T1 includes a gate electrode G, a source electrode S, a drain electrode D, and a bulk electrode B.

The gate electrode G of the transistor T1 can be electrically connected/coupled to an internal node of the detection circuit 10b. The gate electrode G of the transistor T1 can be electrically connected/coupled to the node N5. The bulk electrode B of the transistor T1 can be electrically connected to the node N2.

In the standby mode, the biasing circuit 14c can be bias with $V_{GS}<0$ and $V_{SB}>0$. In the standby mode, the voltage level at the node N4 is configured to be high (for example, VDD) in order to keep the discharge circuit 12b off. In this circumstance, the node N5 at the input of the inverting circuit 10i will be configured to a low voltage level (for example, VSS). The node N1 is supplied with a high voltage level (for example, VDD), and the node N2 is supplied with a low voltage level (for example, VSS). The voltage level at the node N3 will be at around half of that of the node N1, following the voltage divider rule. As a result, the biasing circuit 14c can be biased with $V_{GS}<0$ and $V_{SB}>0$ in the standby mode.

Based on Equations 1 and 2, current $I_{off1}$ of the transistor T1 when the discharge circuit 12b is off (i.e., in the standby mode) can be decreased with bias $V_{GS}<0$ and $V_{SB}>0$. Therefore, the semiconductor device 206 with the biasing circuit 14c incorporated can exhibit a much lower standby current. A semiconductor system that includes the semiconductor device 206 as an ESD protection device can exhibit a longer lifetime.

Figure 4A:
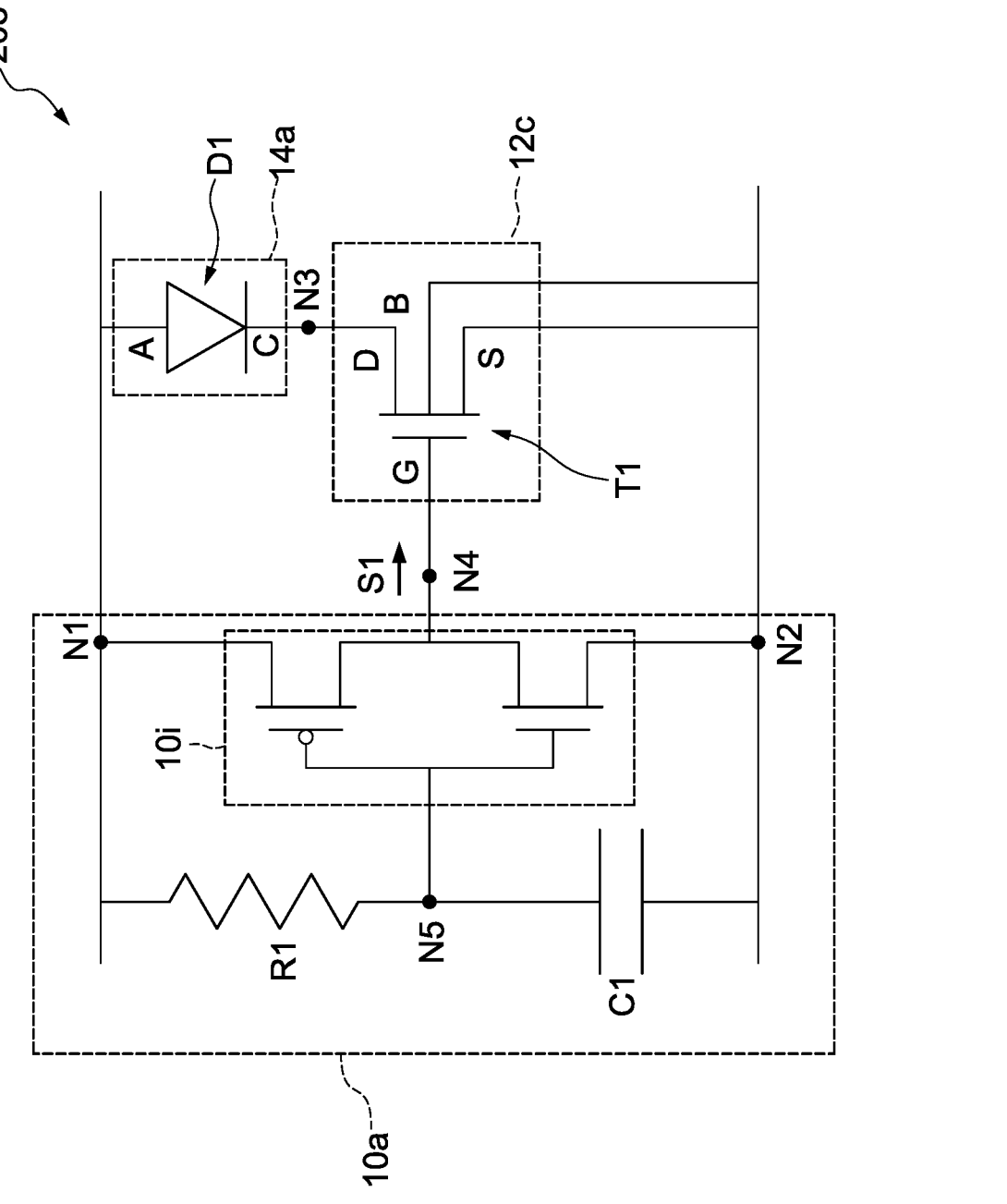
FIG. 4A is a schematic diagram of a semiconductor device, in accordance with some embodiments of the present disclosure.

FIG. 4A is a schematic diagram of a semiconductor device, in accordance with some embodiments of the present disclosure.

FIG. 4A is a schematic diagram of a semiconductor device 208. The semiconductor device 208 can be a part of an electronic system. The semiconductor device 208 can be a part of a semiconductor system. The semiconductor device 208 can be an ESD protection device. The semiconductor device 208 includes a detection circuit 10a, a discharge circuit 12c, and a biasing circuit 14a.

The detection circuit 10a can be electrically coupled/connected between the nodes N1 and N2. The detection circuit 10a includes a resistor R1, a capacitor C1, and an inverting circuit 10i. The resistor R1 can be electrically coupled/connected between the nodes N1 and N5. The capacitor C1 can be electrically coupled/connected between the nodes N2 and N5. The inverting circuit 10i can be electrically coupled/connected to the nodes N1, N2 and N5. The node N5 can be an internal node within the detection circuit 10a.

The inverting circuit 10i includes a p-type transistor and an n-type transistor. In some embodiments, the inverting circuit 10i can include a PMOS and an NMOS. The node N5 can be referred to as an input of the inverting circuit 10i. The node N4 can be referred to as an output of the inverting circuit 10i.

The discharge circuit 12c can be electrically coupled/connected to the nodes N2, N3 and N4. The discharge circuit 12c can include a transistor T1. The transistor T1 includes a gate electrode G, a drain electrode D, a source electrode S, and a bulk electrode B. The gate electrode G of the transistor T1 can be electrically connected to the node N4. The gate electrode G of the transistor T1 is configured to receive the signal S1 provided by the detection circuit 10a.

The drain electrode D of the transistor T1 can be electrically connected to the node N3. The drain electrode D of the transistor T1 can be electrically connected to the biasing circuit 14a through the node N3. The bulk electrode B of the transistor T1 can be electrically connected to the node N2. The source electrode S of the transistor T1 can be electrically connected to the node N2. The bulk electrode B and the source electrode S of the transistor T1 can be electrically connected with each other.

The biasing circuit 14a can be electrically coupled/connected between the nodes N1 and N3. The biasing circuit 14a can include a diode D1. The diode D1 includes an anode A and a cathode C. The anode A of the diode D1 is electrically connected/coupled to the node N1. The cathode C of the diode D1 is electrically connected/coupled to the node N3. The diode D1 can have a P-type doped region embedded within a N-type well region. The diode D1 can be an P+/NW diode.

The biasing circuit 14a coupled/connected between the nodes N1 and N3 can facilitate decreasing the voltage level at the node N3. That is, the voltage level at the node N3 will be at around half of that of the node N1, following the voltage divider rule. A lower voltage level at the node N3 corresponds to a lower $V_{DS}$ for the transistor T1. Referring back to Equation 1, a lower $V_{DS}$ can result in a lower current $I_D$, and thus the current leakage of the transistor T1 can be reduced with the biasing circuit 14a coupled/connected between the nodes N1 and N3.

The biasing circuit 14a and the discharge circuit 12c as configured in accordance with FIG. 4A can be further beneficial to the performance of the semiconductor device 208 in terms of ESD protection. That is, a silicon-controlled rectifier (P-N-P-N) can be constructed between the biasing circuit 14a and the discharge circuit 12c, and can serve as an additional discharge path during ESD events. Details thereof are further described in conjunction with FIG. 5A.

Figure 4B:
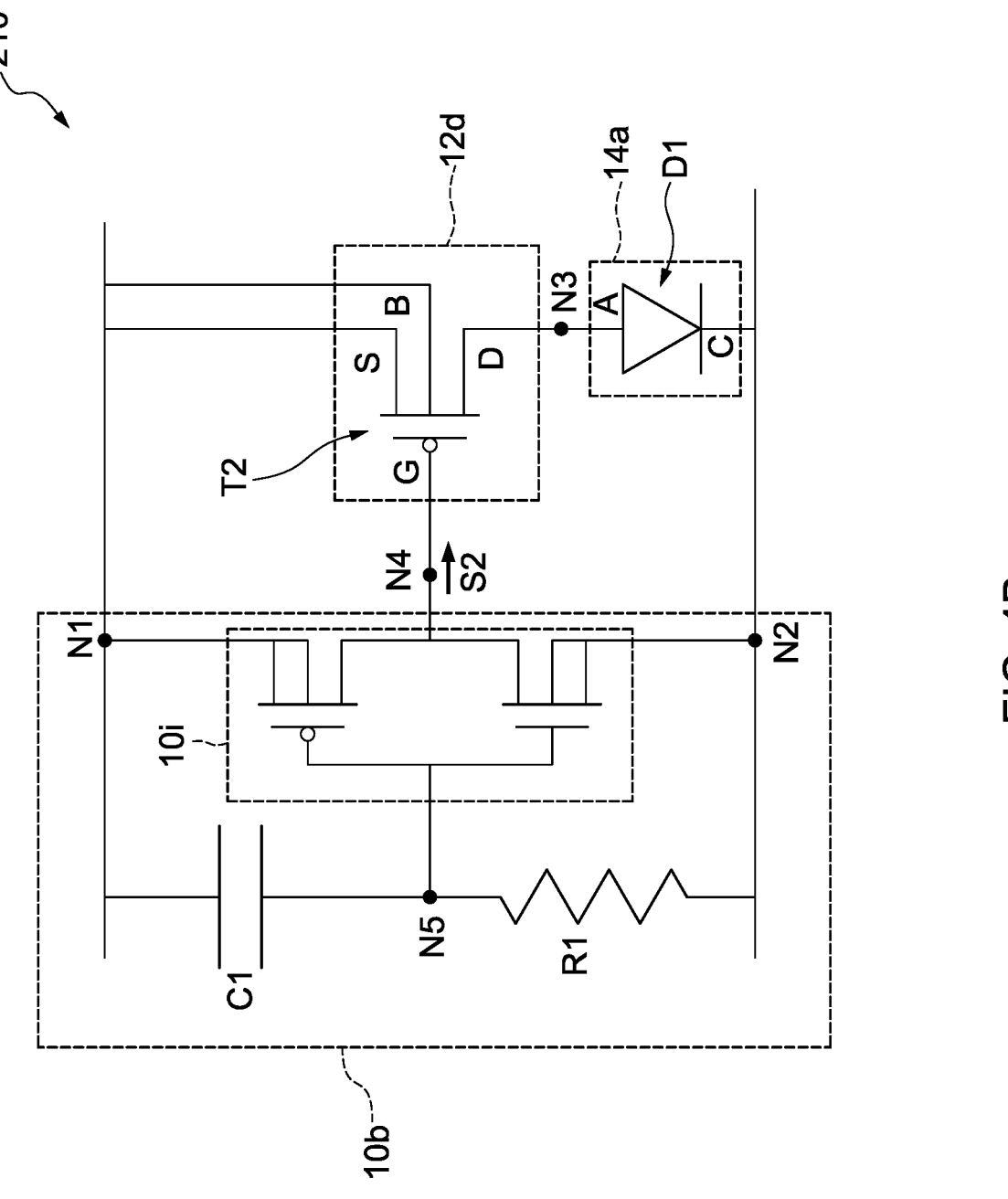
FIG. 4B is a schematic diagram of a semiconductor device, in accordance with some embodiments of the present disclosure.

FIG. 4B is a schematic diagram of a semiconductor device, in accordance with some embodiments of the present disclosure.

FIG. 4B is a schematic diagram of a semiconductor device 210. The semiconductor device 210 can be a part of an electronic system. The semiconductor device 210 can be a part of a semiconductor system. The semiconductor device 210 can be an ESD protection device. The semiconductor device 210 includes a detection circuit 10b, a discharge circuit 12d, and a biasing circuit 14a.

The detection circuit 10b can be electrically coupled/connected between the nodes N1 and N2. The detection circuit 10b includes a resistor R1, a capacitor C1, and an inverting circuit 10i. The resistor R1 can be electrically coupled/connected between the nodes N2 and N5. The capacitor C1 can be electrically coupled/connected between the nodes N1 and N5. The inverting circuit 10i can be electrically coupled/connected to the nodes N1, N2 and N5. The node N5 can be an internal node within the detection circuit 10b.

The inverting circuit 10i includes a p-type transistor and an n-type transistor. In some embodiments, the inverting circuit 10i can include a PMOS and an NMOS. The node N5 can be referred to as an input of the inverting circuit 10i. The node N4 can be referred to as an output of the inverting circuit 10i.

The discharge circuit 12d can be electrically coupled/connected to the nodes N1, N3 and N4. The discharge circuit 12d can include a transistor T2. The transistor T2 includes a gate electrode G, a drain electrode D, a source electrode S, and a bulk electrode B. The gate electrode G of the transistor T2 can be electrically connected to the node N4. The gate electrode G of the transistor T2 is configured to receive the signal S2 provided by the detection circuit 10b.

The drain electrode D of the transistor T2 can be electrically connected to the node N3. The drain electrode D of the transistor T2 can be electrically connected to the biasing circuit 14a through the node N3. The bulk electrode B of the transistor T2 can be electrically connected to the node N1. The source electrode S of the transistor T2 can be electrically connected to the node N1. The bulk electrode B and the source electrode S of the transistor T2 can be electrically connected with each other.

The biasing circuit 14a can be electrically coupled/connected between the nodes N2 and N3. The biasing circuit 14a can include a diode D1. The diode D1 includes an anode A and a cathode C. The anode A of the diode D1 is electrically connected/coupled to the node N3. The cathode C of the diode D1 is electrically connected/coupled to the node N2.

In some embodiments, the diode D1 can have a P-type doped region embedded within a N-type well region. In some embodiments, the diode D1 can be an P+/NW diode. In some embodiments, the diode D1 can have a N-type doped region embedded within a P-type well region. In some embodiments, the diode D1 can be an PW/N+ diode.

The biasing circuit 14a coupled/connected between the nodes N2 and N3 can facilitate increasing the voltage level at the node N3. That is, the voltage level at the node N3 will be at around half of that of the node N1, following the voltage divider rule. A higher voltage level at the node N3 correspond to a lower $V_{DS}$ for the transistor T2. Referring back to Equation 1, a lower $V_{DS}$ can result in a lower current $I_D$, and thus the current leakage of the transistor T2 can be reduced with the biasing circuit 14a coupled/connected between the nodes N2 and N3.

The biasing circuit 14a and the discharge circuit 12d as configured in accordance with FIG. 4B can be further beneficial to the performance of the semiconductor device 210 in terms of ESD protection. That is, a silicon-controlled rectifier (P-N-P-N) can be constructed between the biasing circuit 14a and the discharge circuit 12d, which can serve as an additional discharge path during ESD events. The details thereof are discussed further in reference to FIGS. 5B and 5C.

Figure 5A:
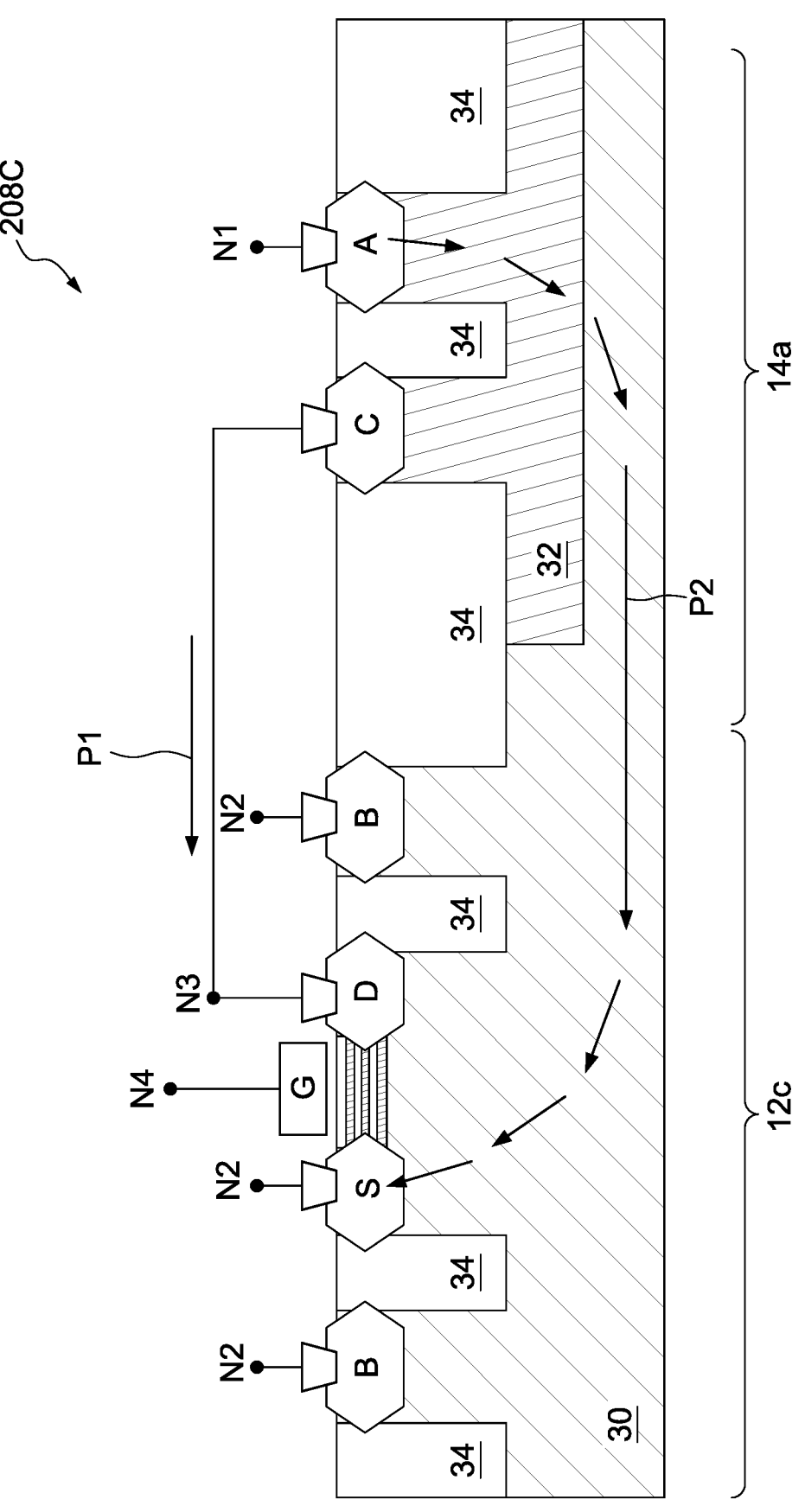
FIG. 5A is a cross-section of a portion of a semiconductor device, in accordance with some embodiments of the present disclosure.

FIG. 5A is a cross-section of a portion of a semiconductor device, in accordance with some embodiments of the present disclosure.

FIG. 5A is a cross-section of a portion 208C of the semiconductor device 208. The portion 208C includes regions for the discharge circuit 12c and the biasing circuit 14a. The portion 208C includes a well region 30 of a first type, a well region 32 of a second type, and shallow trench isolations (STI) 34.

The bulk electrodes B, the source electrode S, and the drain electrode D of the discharge circuit 12c can be separated by the STIs 34. The bulk electrodes B, the source electrode S, and the drain electrode D of the discharge circuit 12c can each be a doped region within the well region 30. The source electrode S and the drain electrode D of the discharge circuit 12c can be of the same type, and the bulk electrode B of the discharge circuit 12c can be of a different type. The gate electrode G of the discharge circuit 12c can be disposed between the drain electrode D and the source electrode S.

In some embodiments, the well region 30 can be a P-type well region, and the well region 32 can be a N-type well region.

In some embodiments, the source electrode S and the drain electrode D of the discharge circuit 12c can be N-type doped regions, and the bulk electrodes B of the discharge circuit 12c can be P-type doped regions.

The anode A and the cathode C of the biasing circuit 14a can be separated by the STI 34.

The anode A and the cathode C of the biasing circuit 14a can each be a doped region within the well region 32. The anode A and the cathode C of the biasing circuit 14a can be of different types. In some embodiments, the anode A of the biasing circuit 14a can be a P-type doped region. In some embodiments, the cathode C of the biasing circuit 14a can be a N-type doped region. In some embodiments, the biasing circuit 14a can be an P+/NW diode.

A discharge current path P1 can be established between the cathode C of the biasing circuit 14a and the drain electrode D of the discharge circuit 12c. Current incurred by ESD events can be dissipated through the discharge current path P1. A discharge current path P2 can be established between the anode A of the biasing circuit 14a and the source electrode S of the discharge circuit 12c. Current incurred by ESD events can be dissipated through the discharge current path P2.

The discharge current path P2 can be established, through a silicon-controlled rectifier (P-N-P-N) constructed within the discharge circuit 12c and the biasing circuit 14a. The discharge current path P2 starts from the P-type anode A of the biasing circuit 14a to the N-type doped source electrode S of the discharge circuit 12c, through the N-type well region 32 and the P-type well region 30.

The additional discharge current path P2 can be further beneficial to the capability of the semiconductor device 208 in terms of ESD protection.

Figure 5B:
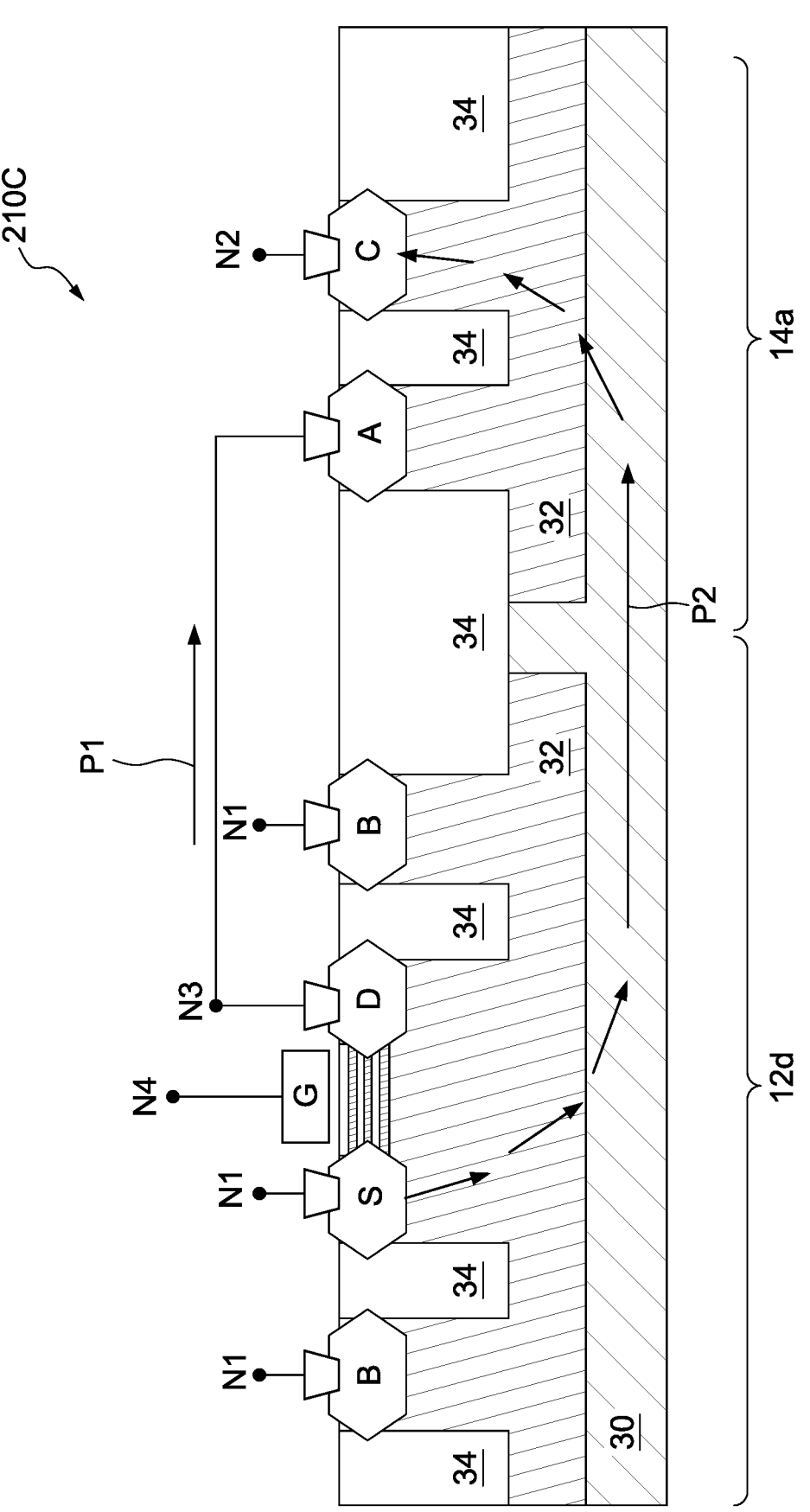
FIG. 5B is a cross-section of a portion of a semiconductor device, in accordance with some embodiments of the present disclosure.

FIG. 5B is a cross-section of a portion of a semiconductor device, in accordance with some embodiments of the present disclosure.

FIG. 5B shows a cross-section of a portion 210C of the semiconductor device 210. The portion 210C includes regions for the discharge circuit 12d and the biasing circuit 14a. The portion 210C includes a well region 30 of a first type, well regions 32 of a second type, and STIs 34.

The bulk electrodes B, the source electrode S, and the drain electrode D of the discharge circuit 12d can be separated by the STIs 34. The bulk electrodes B, the source electrode S, and the drain electrode D of the discharge circuit 12d can each be a doped region within the well region 32. The source electrode S and the drain electrode D of the discharge circuit 12d can be of the same type, and the bulk electrode B of the discharge circuit 12d can be of a different type. The gate electrode G of the discharge circuit 12d can be disposed between the drain electrode D and the source electrode S.

In some embodiments, the well region 30 can be a P-type well region, and the well region 32 can be a N-type well region.

In some embodiments, the source electrode S and the drain electrode D of the discharge circuit 12d can be P-type doped regions, and the bulk electrodes B of the discharge circuit 12d can be N-type doped regions.

The anode A and the cathode C of the biasing circuit 14a can be separated by the STI 34.

The anode A and the cathode C of the biasing circuit 14a can each be a doped region within the well region 32. The anode A and the cathode C of the biasing circuit 14a can be of different types. In some embodiments, the anode A of the biasing circuit 14a can be a P-type doped region. In some embodiments, the cathode C of the biasing circuit 14a can be a N-type doped region. In some embodiments, the biasing circuit 14a can be a P+/NW diode.

A discharge current path P1 can be established between the drain electrode D of the discharge circuit 12d and the anode A of the biasing circuit 14a. Current incurred by ESD events can be dissipated through the discharge current path P1. A discharge current path P2 can be established between the source electrode S of the discharge circuit 12d and the cathode C of the biasing circuit 14a. Current incurred by ESD events can be dissipated through the discharge current path P2.

The discharge current path P2 can be established, through a silicon-controlled rectifier (P-N-P-N) constructed within the discharge circuit 12d and the biasing circuit 14a. The discharge current path P2 starts from the P-type source electrode S of the discharge circuit 12d to the N-type doped cathode C of the biasing circuit 14a, through the N-type well region 32 and the P-type well region 30.

The additional discharge current path P2 can be further beneficial to the capability of the semiconductor device 210 in terms of ESD protection.

Figure 5C:
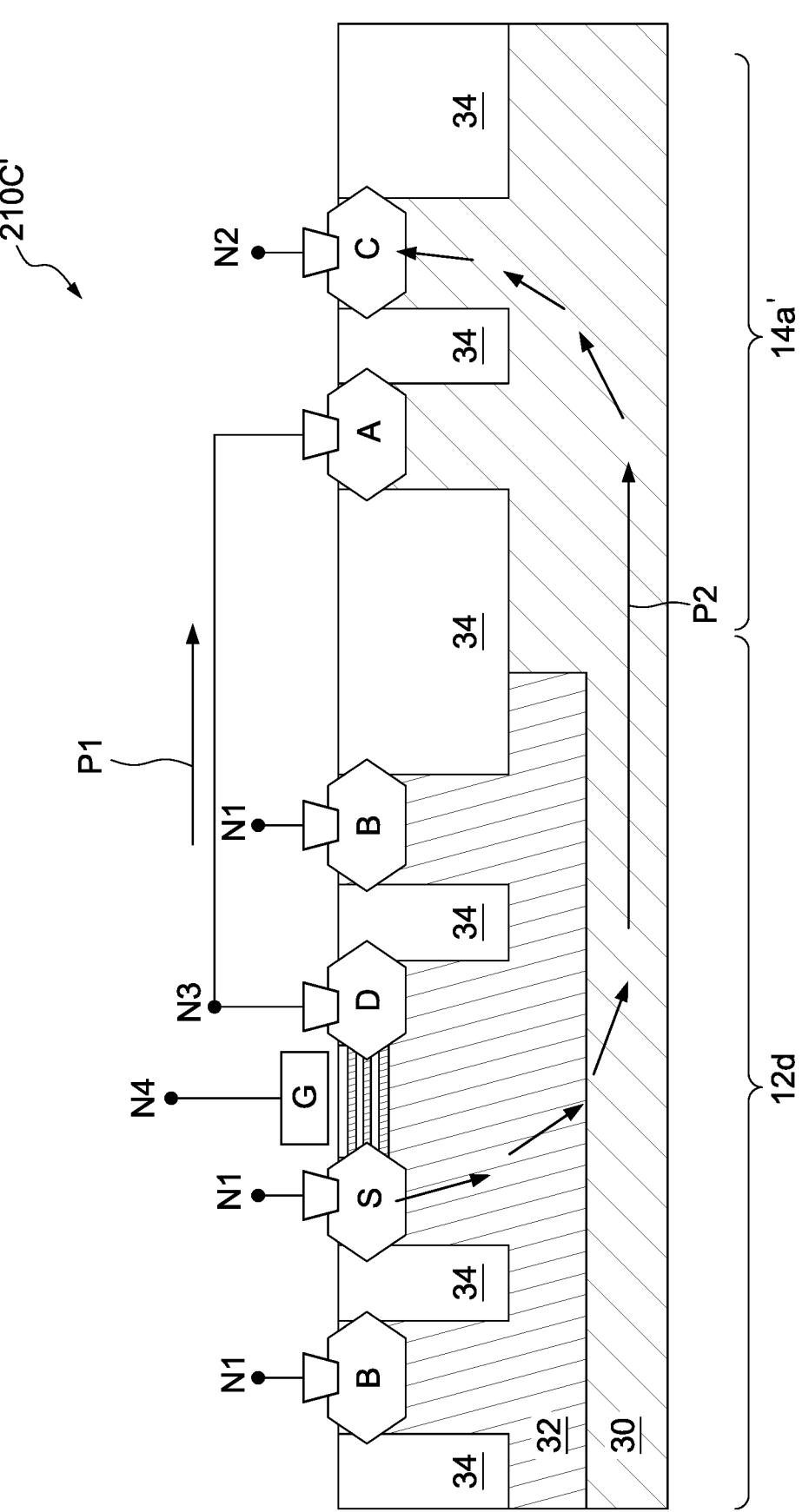
FIG. 5C is a cross-section of a portion of a semiconductor device, in accordance with some embodiments of the present disclosure.

FIG. 5C is a cross-section of a portion of a semiconductor device, in accordance with some embodiments of the present disclosure.

FIG. 5C is a cross-section of a portion 210C' of the semiconductor device 210. The portion 201C' is similar to the portion 201C of FIG. 5B, the difference lies in that the portion 201C' includes a biasing circuit 14a' different in structure than the biasing circuit 14a of FIG. 5B.

The portion 210C' includes regions for the discharge circuit 12d and the biasing circuit 14a'. The portion 210C' includes a well region 30 of a first type, a well region 32 of a second type, and STIs 34.

The bulk electrodes B, the source electrode S, and the drain electrode D of the discharge circuit 12d can be separated by the STIs 34. The bulk electrodes B, the source electrode S, and the drain electrode D of the discharge circuit 12d can each be a doped region within the well region 32. The source electrode S and the drain electrode D of the discharge circuit 12d can be of the same type, and the bulk electrode B of the discharge circuit 12d can be of a different type. The gate electrode G of the discharge circuit 12d can be disposed between the drain electrode D and the source electrode S.

In some embodiments, the well region 30 can be a P-type well region, and the well region 32 can be a N-type well region.

In some embodiments, the source electrode S and the drain electrode D of the discharge circuit 12d can be P-type doped regions, and the bulk electrodes B of the discharge circuit 12d can be N-type doped regions.

The anode A and the cathode C of the biasing circuit 14a' can be separated by the STI 34.

The anode A and the cathode C of the biasing circuit 14a' can each be a doped region within the well region 30. The anode A and the cathode C of the biasing circuit 14a' can be of different types. In some embodiments, the anode A of the biasing circuit 14a' can be a P-type doped region. In some embodiments, the cathode C of the biasing circuit 14a' can be a N-type doped region. In some embodiments, the biasing circuit 14a' can be an PW/N+ diode.

A discharge current path P1 can be established between the drain electrode D of the discharge circuit 12d and the anode A of the biasing circuit 14a'. Current incurred by ESD events can be dissipated through the discharge current path P1. A discharge current path P2 can be established between the source electrode S of the discharge circuit 12d and the cathode C of the biasing circuit 14a'. Current incurred by ESD events can be dissipated through the discharge current path P2.

The discharge current path P2 can be established, through a silicon-controlled rectifier (P-N-P-N) constructed within the discharge circuit 12d and the biasing circuit 14a'. The discharge current path P2 starts from the P-type source electrode S of the discharge circuit 12d to the N-type doped cathode C of the biasing circuit 14a', through the N-type well region 32 and the P-type well region 30.

The additional discharge current path P2 can be further beneficial to the capability of the semiconductor device 210 in terms of ESD protection.

FIG. 6 is a flowchart of operating a semiconductor device, in accordance with some embodiments of the present disclosure.

FIG. 6 is a flowchart 600 of manufacturing a semiconductor device, including operations 602, 604, 606 and 608. Although the operations 602, 604, 606 and 608 of FIG. 6 are depicted in sequence, it can be contemplated that the operations 602, 604, 606 and 608 can be performed in an order other than that shown in FIG. 6.

In the operation 602, a discharge circuit can be deactivated by a first signal. The operation 602 can be performed on, for example, the discharge circuit 12 of FIGS. 1A and 1B. The operation 602 can be performed on, for example, the discharge circuit 12a of FIGS. 2A and 3A. The operation 602 can be performed on, for example, the discharge circuit 12b of FIGS. 2B and 3B. The operation 602 can be performed on, for example, the discharge circuit 12c of FIG. 4A or the discharge circuit 12d of FIG. 4B.

In the operation 604, a first voltage difference can be established between a gate electrode and a source electrode of the discharge circuit. The operation 604 can be performed on, for example, the semiconductor device 200, between the nodes N3 and N4. The operation 604 can be performed on, for example, the semiconductor device 202, between the nodes N3 and N4. The operation 604 can be performed on, for example, the semiconductor device 204, between the nodes N3 and N4. The operation 604 can be performed on, for example, the semiconductor device 206, between the nodes N3 and N4.

In the operation 606, a second voltage difference can be established between the source electrode and a bulk electrode of the discharge circuit. The operation 606 can be performed on, for example, the semiconductor device 200, between the nodes N2 and N3. The operation 604 can be performed on, for example, the semiconductor device 202, between the nodes N1 and N3. The operation 604 can be performed on, for example, the semiconductor device 204, between the nodes N2 and N3. The operation 604 can be performed on, for example, the semiconductor device 206, between the nodes N1 and N3.

In the operation 608, the second voltage difference can be established by connecting a biasing circuit between the bulk electrode and the source electrode of the discharge circuit. The operation 608 can be performed by, for example, connecting a biasing circuit 14a to the semiconductor device 200, between the bulk electrode and the source electrode of the discharge circuit 12a. The operation 608 can be performed by, for example, connecting a biasing circuit 14a to the semiconductor device 202, between the bulk electrode and the source electrode of the discharge circuit 12b. The operation 608 can be performed by, for example, connecting a biasing circuit 14b to the semiconductor device 204, between the bulk electrode and the source electrode of the discharge circuit 12a. The operation 608 can be performed by, for example, connecting a biasing circuit 14c to the semiconductor device 206, between the bulk electrode and the source electrode of the discharge circuit 12b.

Figures 7A, 7B:
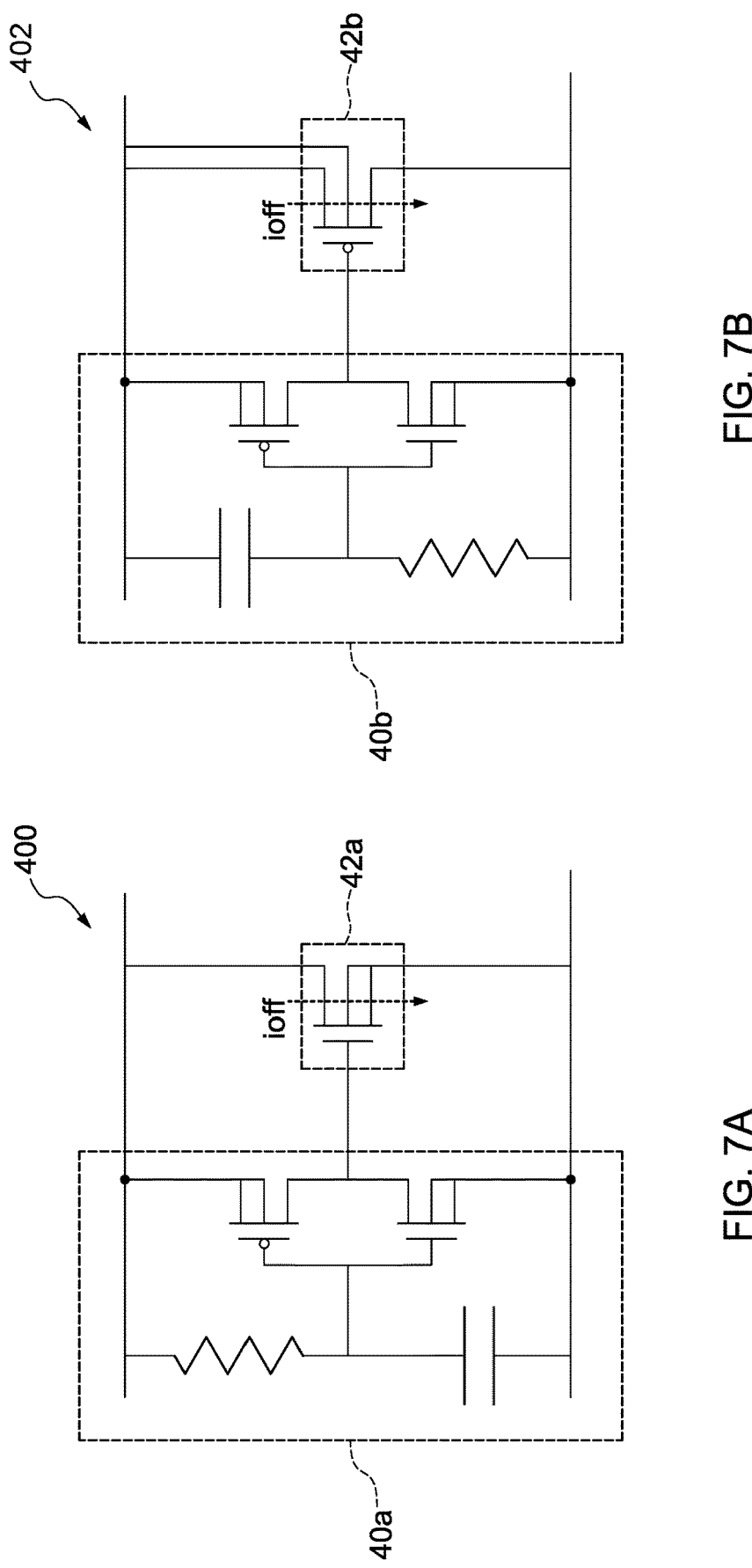
FIG. 7A is a schematic diagram of a semiconductor device, in accordance with some comparative embodiments of the present disclosure.
FIG. 7B is a schematic diagram of a semiconductor device, in accordance with some comparative embodiments of the present disclosure.

FIG. 7A is a schematic diagram of a semiconductor device, in accordance with some comparative embodiments of the present disclosure.

FIG. 7A is a schematic diagram of a semiconductor device 400. The semiconductor device 400 can be an ESD protection device. The semiconductor device 400 includes a detection circuit 40a and a discharge circuit 42a. The discharge circuit 42a can be a transistor having a relatively large channel width. The discharge circuit 42a can be a transistor having a channel width equaling or exceeding 1000 micrometers (μm).

The discharge circuit 42a can be a major contributor of the current leakage in the "standby mode" of the semiconductor device 400. Without a biasing circuit, the leakage current $I_{off}$ of the discharge circuit 42a can be relatively greater than that of the discharge circuits 12a, 12b, 12c or 12d.

FIG. 7B is a schematic diagram of a semiconductor device, in accordance with some comparative embodiments of the present disclosure.

FIG. 7B is a schematic diagram of a semiconductor device 40. The 2 semiconductor device 402 can be an ESD protection device. The semiconductor device 402 includes a detection circuit 40b and a discharge circuit 42b. The discharge circuit 42b can be a transistor having a relatively large channel width. The discharge circuit 42b can be a transistor having a channel width equaling or exceeding 1000 micrometers (μm).

The discharge circuit 42b can be a major contributor of the current leakage in the "standby mode" of the semiconductor device 402. Without a biasing circuit, leakage current $I_{off}$ of the discharge circuit 42b can be relatively higher than that of the discharge circuits 12a, 12b, 12c or 12d.

Some embodiments of the present disclosure provide a semiconductor device. The semiconductor device comprises a detection circuit electrically coupled between a first node and a second node. The semiconductor device comprises a discharge circuit electrically coupled between the first node and a third node. The semiconductor device comprises a biasing circuit electrically coupled between the second node and the third node. The discharge circuit and the biasing circuit are configured to electrically conducting the first node and the second node in response to receiving a first signal from the detection circuit through a fourth node. Wherein a first voltage difference exists between the third node and the fourth node.

Some embodiments of the present disclosure provide a semiconductor device. The semiconductor device comprises a detection circuit configured to generate a first signal in response to an Electrostatic discharge (ESD) event. The semiconductor device comprises a discharge circuit electrically connected to the detection circuit and configured to receive the first signal. The semiconductor device comprises a biasing circuit electrically connected to the discharge circuit. Wherein the first signal triggers a current associated with the ESD event to flow through the discharge circuit and the biasing circuit.

Some embodiments of the present disclosure provide a method of operating a semiconductor device. The method comprises: deactivating a discharge circuit by providing a first signal to the discharge circuit, establishing a first voltage difference between a gate electrode and a source electrode of the discharge circuit, and establishing a second voltage difference between the source electrode and a bulk electrode of the discharge circuit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a detection circuit electrically coupled between a first node and a second node;
   a discharge circuit electrically coupled between the first node and a third node; and
   a biasing circuit electrically coupled between the second node and the third node,
   wherein the discharge circuit and the biasing circuit are configured to electrically conducting the first node and the second node in response to receiving a first signal from the detection circuit through a fourth node; wherein:

the discharge circuit comprises a P-type transistor having a gate electrode electrically coupled to the fourth node, a first electrode electrically coupled to the third node, a second electrode electrically coupled to the first node, and a bulk electrode electrically coupled to the first node;

a first width of the P-type transistor is larger than a second width of any transistor or diode in the detection circuit and the biasing circuit;

the first electrode and the second electrode of the P-type transistor are a first P-type doped region and a second P-type doped region formed within a first N-type well region above a P-type substrate, respectively;

a first portion and a second portion of the bulk electrode are a first N-type doped region and a second N-type doped region within the first N-type well region, the first N-type doped region and the second N-type doped region are electrically connected to the first node, the first portion and the first electrode are separated by a first isolation component, and the second portion and the second electrode are separated by a second isolation component;

the first P-type doped region and the second P-type doped region are disposed between the first N-type doped region and the second N-type doped region within the first N-type well region;

the biasing circuit comprises a diode including an anode and a cathode that are formed within a second N-type well region above the P-type substrate, the anode is a third P-type doped region electrically coupled to the third node, the cathode is a third N-type doped region electrically coupled to the second node, the third P-type doped region and the third N-type doped region are separated by a third isolation component, and the first N-type well region and the second N-type well region are separated by a fourth isolation component;

the first N-type doped region is disposed between the first P-type doped region and the third P-type doped region;

the third P-type doped region is disposed between the third N-type doped region and the first N-type doped region;

a diode-free conductive element is electrically connected between the first P-type doped region and the third P-type doped region;

in response to an electrostatic discharge (ESD) event occurring at the first node, a first discharge current path is established between the first electrode of the P-type transistor and the third P-type doped region; and in response to the ESD event, a second discharge path is established from the second P-type doped region to the third N-type doped region through the first N-type well region, the P-type substrate, and the second N-type well region.

2. The semiconductor device of claim 1, wherein the detection circuit comprises:
   a resistor electrically coupled between the second node and a fifth node;
   an inverting circuit electrically coupled between the fourth node and the fifth node; and
   a capacitor electrically coupled between the first node and the fifth node.

3. The semiconductor device of claim 1, wherein the biasing circuit is configured such that a third voltage level at the third node is around half of a first voltage level of the first node.

4. The semiconductor device of claim 1, wherein the biasing circuit is configured to suppress leakage current of the discharge circuit when the discharge circuit is turned off by the first signal.

5. The semiconductor device of claim 1, wherein a silicon-controlled rectifier is constructed along the second discharge path between the biasing circuit and the discharge circuit.

6. The semiconductor device of claim 1, wherein an overall discharge current of the semiconductor device during the ESD event comprises a first discharge current along the first discharge current path and a second discharge current along the second discharge current path.

7. The semiconductor device of claim 1, wherein in response to the ESD event, the diode is forward biased which is shared by the first discharge path and the second discharge path.

8. The semiconductor device of claim 1, wherein in response to the ESD event occurring on the first node, the first signal is in a low logic state to turn on the discharge circuit and the biasing circuit to electrically conducting the first node and the second node.

9. A semiconductor device, comprising:

a detection circuit configured to generate a first signal in response to an Electrostatic discharge (ESD) event;

a discharge circuit comprising a P-type transistor having a gate electrode electrically connected to the detection circuit and configured to receive the first signal, a first electrode electrically coupled to a first node, a second electrode electrically coupled to a second node, and a bulk electrode electrically coupled to the first node; and a biasing circuit electrically connected to the discharge circuit, wherein:

the P-type transistor has a first width larger than a second width of any transistor or diode in the detection circuit and the biasing circuit;

the first signal triggers a current associated with the ESD event to flow through the discharge circuit and the biasing circuit;

the first electrode and the second electrode of the P-type transistor are a first P-type doped region and a second P-type doped region formed within a first N-type well region above a P-type substrate, respectively;

a first portion and a second portion of the bulk electrode are a first N-type doped region and a second N-type doped region within the first N-type well region, the first N-type doped region and the second N-type doped region are electrically connected to the first node, the first portion and the first electrode are separated by a first isolation component, and the second portion and the second electrode are separated by a second isolation component;

the first P-type doped region and the second P-type doped region are disposed between the first N-type doped region and the second N-type doped region within the first N-type well region;

the biasing circuit comprises a diode including an anode and a cathode that are formed within a second N-type well region above the P-type substrate, the anode is a third P-type doped region electrically coupled to the third node, the cathode is a third N-type doped region electrically coupled to the second node, the third P-type doped region and the third N-type doped region are separated by a third isolation component, and the first N-type well region and the second N-type well region are separated by a fourth isolation component;

the first N-type doped region is disposed between the first P-type doped region and the third P-type doped region;

the third P-type doped region is disposed between the third N-type doped region and the first N-type doped region;

a diode-free conductive element is electrically connected between the first P-type doped region and the third P-type doped region;

in response to the ESD event occurring at the first node, a first discharge current path is established between the first electrode of the P-type transistor and the third P-type doped region; and in response to the ESD event, a second discharge path is established from the second P-type doped region to the third N-type doped region through the first N-type well region, the P-type substrate, and the second N-type well region.

10. The semiconductor device of claim 9, wherein in response to the ESD event, the diode is forward biased which is shared by the first discharge path and the second discharge path.

11. The semiconductor device of claim 9, wherein:

the biasing circuit is configured such that a third voltage level at the third node is around half of a first voltage level of the first node.

12. The semiconductor device of claim 9, wherein the biasing circuit is configured to suppress leakage current of the discharge circuit when the discharge circuit is turned off by the first signal.

13. The semiconductor device of claim 9, wherein a silicon-controlled rectifier is constructed along the second discharge path between the biasing circuit and the discharge circuit.

14. The semiconductor device of claim 9, wherein an overall discharge current of the semiconductor device during the ESD event comprises a first discharge current along the first discharge current path and a second discharge current along the second discharge current path.

15. The semiconductor device of claim 9, wherein the first isolation component, the second isolation components, the third isolation component, and the fourth isolation component are shallow trench isolation (STI) components.

16. A semiconductor device, comprising:

a detection circuit electrically coupled between a first node and a second node;

a discharge circuit electrically coupled between the first node and a third node; and a biasing circuit electrically coupled between the second node and the third node, wherein:

the detection circuit is configured to turn on the discharge circuit in response to an Electrostatic discharge (ESD) event occurring at the first node and keep the discharge circuit off when no ESD event occurs;

the discharge circuit comprises a P-type transistor having a gate electrode electrically coupled to the fourth node, a first electrode electrically coupled to the third node, a second electrode electrically coupled to the first node, and a bulk electrode electrically coupled to the first node;

a first width of the P-type transistor is larger than a second width of any transistor or diode in the detection circuit and the biasing circuit;

the first electrode and the second electrode of the P-type transistor are a first P-type doped region and a second P-type doped region formed within a first N-type well region above a P-type substrate, respectively;

a first portion and a second portion of the bulk electrode are a first N-type doped region and a second N-type doped region within the first N-type well region, the first N-type doped region and the second N-type doped region are electrically connected to the first node, the first portion and the first electrode are separated by a first isolation component, and the second portion and the second electrode are separated by a second isolation component;

the first P-type doped region and the second P-type doped region are disposed between the first N-type doped region and the second N-type doped region within the first N-type well region;

the biasing circuit comprises a diode including an anode and a cathode that are formed within a second N-type well region above the P-type substrate, the anode is a third P-type doped region electrically coupled to the third node, the cathode is a third N-type doped region electrically coupled to the second node, the third P-type doped region and the third N-type doped region are separated by a third isolation component, and the first N-type well region and the second N-type well region are separated by a fourth isolation component;

the first N-type doped region is disposed between the first P-type doped region and the third P-type doped region;

the third P-type doped region is disposed between the third N-type doped region and the first N-type doped region;

a diode-free conductive element is electrically connected between the first P-type doped region and the third P-type doped region;

in response to the ESD event occurring at the first node, a first discharge current path is established between the first electrode of the P-type transistor and the third P-type doped region; and in response to the ESD event, a second discharge path is established from the second P-type doped region to the third N-type doped region through the first N-type well region, the P-type substrate, and the second N-type well region.

17. The semiconductor device of claim 16, wherein the biasing circuit is configured such that a third voltage level at the third node is around half of a first voltage level of the first node.

18. The semiconductor device of claim 16, wherein a silicon-controlled rectifier is constructed along the second discharge path between the biasing circuit and the discharge circuit.

19. The semiconductor device of claim 16, wherein an overall discharge current of the semiconductor device during the ESD event comprises a first discharge current along the first discharge current path and a second discharge current along the second discharge current path.

20. The semiconductor device of claim 16, wherein in response to the ESD event, the diode is forward biased which is shared by the first discharge path and the second discharge path.

* * * * *